United States Patent [19]

Colvin, Sr.

[11] Patent Number: 5,489,865
[45] Date of Patent: Feb. 6, 1996

[54] CIRCUIT FOR FILTERING ASYNCHRONOUS METASTABILITY OF CROSS-COUPLED LOGIC GATES

[75] Inventor: Bryan J. Colvin, Sr., San Jose, Calif.

[73] Assignee: Media Vision, Inc., Fremont, Calif.

[21] Appl. No.: 843,492

[22] Filed: Feb. 28, 1992

[51] Int. Cl.$^6$ ........................................... H03K 3/353
[52] U.S. Cl. ........................... 327/198; 327/22; 327/23; 326/94
[58] Field of Search ................ 307/272.1, 272.2, 307/272.3, 291, 262, 471, 479; 328/109, 110, 164; 327/22, 23, 185, 202, 198, 215; 326/52, 54, 94

[56] References Cited

U.S. PATENT DOCUMENTS

| | | | |
|---|---|---|---|
| 3,278,758 | 10/1966 | Vroman | 307/471 |
| 3,453,537 | 7/1969 | Meyer | 328/110 |
| 4,185,210 | 1/1980 | Zuk | 307/528 |
| 4,251,884 | 2/1981 | Baun, Jr. | 307/471 |
| 4,267,514 | 5/1981 | Kimsey | 328/110 |
| 4,308,472 | 12/1981 | McLaughlin | 307/471 |
| 4,471,235 | 9/1984 | Sakhuja et al. | 307/471 |
| 4,495,621 | 1/1985 | Nakagomi et al. | 371/6 |
| 5,083,049 | 1/1992 | Kagey | 307/272.2 |

*Primary Examiner*—Terry Cunningham
*Attorney, Agent, or Firm*—Claude A. S. Hamrick

[57] ABSTRACT

A circuit is provided for filtering asynchronous metastability. The circuit includes two or more output lines that provide signals indicative of the assertion of control or data input signals at a plurality of input lines. Despite the simultaneous assertion of two or more input signals, the circuit prevents the simultaneous assertion of more than one output signal, thereby preventing adverse effects within a digital system connected to the circuit.

8 Claims, 5 Drawing Sheets

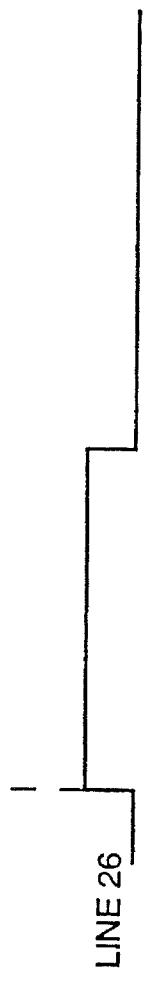
Fig. 4a LINE 26
Fig. 4b LINE 28
Fig. 4c LINE 30
Fig. 4d EXCLUSIVE OR GATE 20
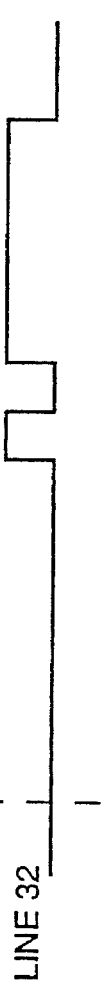
Fig. 4e LINE 32

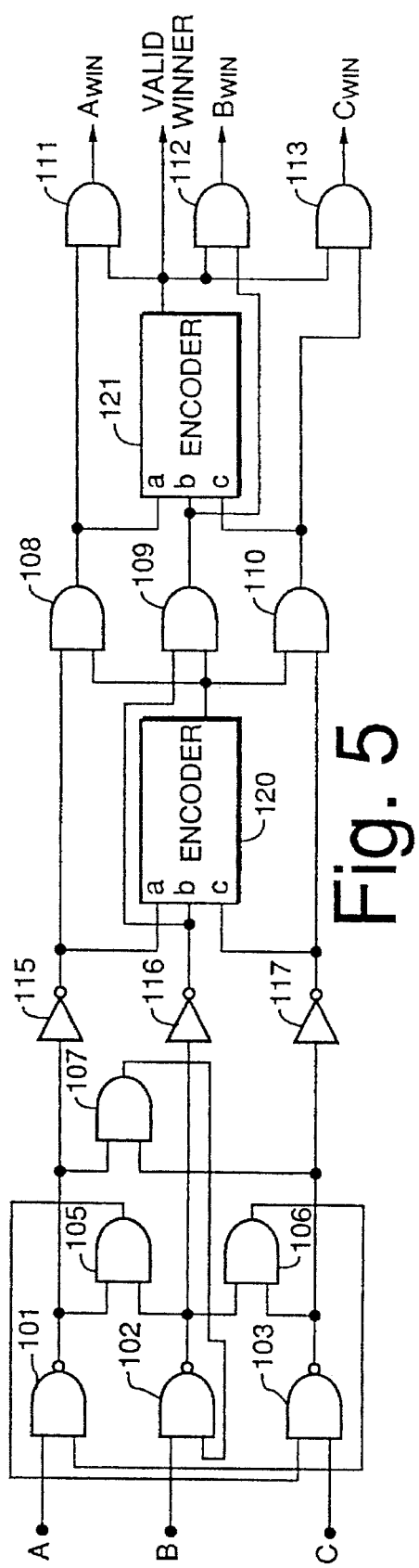
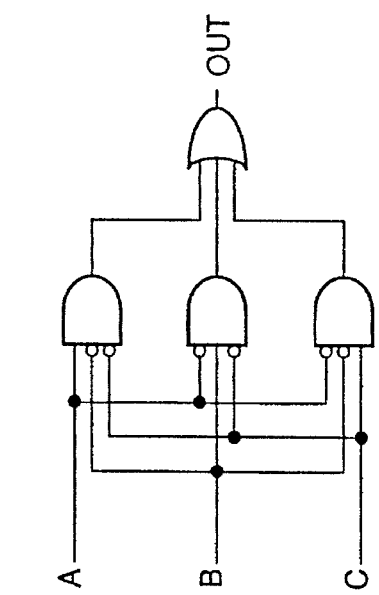
Fig. 5
Fig. 5a
Fig. 5b

CIRCUIT FOR FILTERING ASYNCHRONOUS METASTABILITY OF CROSS-COUPLED LOGIC GATES

BACKGROUND OF THE INVENTION

1. Field of the Invention

This invention relates to digital circuits and more particularly to digital circuits wherein metastability oscillation occurs.

2. Description of the Relevant Art

Metastability is a well-known problem that occurs when two or more asynchronous input signals are asserted simultaneously to initiate a response by a given digital system that receives the input signals. The problem arises since the digital system receiving the asserted input signals is configured such that it can receive and process only one asserted input signal at a time. In such a situation, one of the asserted input signals must be determined as the "winner"; that is, one of the signals must override the other simultaneously asserted signals. The asynchronous input signals may be either control or data signals. Typically, the asynchronous input signals are provided to several cross-coupled logic gates such as NAND gates that provide output signals indicative of the "winner" of the asserted input signals. In the situation where only one input signal is asserted at a time, the output signal does not oscillate. However, when the asynchronous input signals are asserted simultaneously, the output signals of the cross-coupled NAND gates oscillate synchronously until becoming unsynchronized due to the inherently different delay characteristics of the logic gates. This oscillation period is known as the metastability period. A stable output signal is thereafter provided at an output line of one of the NAND gates. Unfortunately, during the metastability period, adverse effects can be triggered within the digital system receiving the oscillating output signals. It is therefore desirable to eliminate the adverse effects of metastability oscillation.

One method used to eliminate the adverse effects of metastability oscillation involves the filtering of the metastable inputs by using flip-flops as shown in FIG. 1. Unfortunately, the system of FIG. 1 causes the asynchronous signal generated at the output of the state machine 5 to be delayed by one clock cycle. If metastability persists more than one clock cycle, the system will fail. In addition, the circuit does not guarantee a winner. If both inputs are true simultaneously, a winner is chosen at random or by priority.

Another technique is known as arbitration. This technique involves the generation of a timing pulse window when one or more signals request control. Pre-assigned priorities within the timing pulse window determines the winner. This technique is slow and requires a priority encoder. In addition, the system requires a clock signal and the synchronization of several signals.

SUMMARY OF THE INVENTION

In accordance with the present invention, a circuit is provided for filtering asynchronous metastability of cross-coupled logic gates. The circuit includes two or more output lines that provide signals indicative of the assertion of control or data signals at a plurality of input lines. Despite the simultaneous assertion of two or more input signals, the circuit prevents the simultaneous assertion of more than one output signal, thereby preventing adverse effects within a digital system connected to the circuit.

These and other advantages are achieved by the present invention, in accordance with which a circuit is provided that includes a generating means that generates a plurality of signals characterized by metastability oscillation including at least a first terminal and a second terminal whereat the metastability oscillation characteristic occurs. The generating means is coupled to a metastability filter that comprises a one-and-only-one-input-set encoding having at least a first input line coupled to the first terminal, and a second input line coupled to the second terminal. The encoding means generates an enable signal only when a signal provided from the generating means to one of the input lines is asserted while another signal provided to the other input is deasserted. An output enable circuit is coupled to receive the enable signal of the encoding means and includes at least a first output line and a second output line, wherein one of the output lines provides an output signal only when the enable signal is provided by the encoding means.

The invention will be more readily understood by reference to the drawings and the detailed description. As will be appreciated by one skilled in the art, the invention is applicable to systems having means for preventing the adverse effects of metastability oscillation in general, and is not limited to the specific embodiment disclosed.

BRIEF DESCRIPTION OF THE DRAWINGS

FIGS. 4A–4E are a set of waveforms illustrating the input and output signals associated with the first embodiment of the invention.

FIG. 5 is a schematic diagram of a three-input circuit for filtering metastability.

FIG. 5A is a truth table representation of the encoding means of FIG. 5.

FIG. 5B is a schematic diagram of a circuit implementation of the encoding means.

DETAILED DESCRIPTION

The following includes a detailed description of the best presently contemplated mode for carrying out the invention. The description is intended to be merely illustrative of the invention and should not be taken in a limiting sense.

Figure 2:
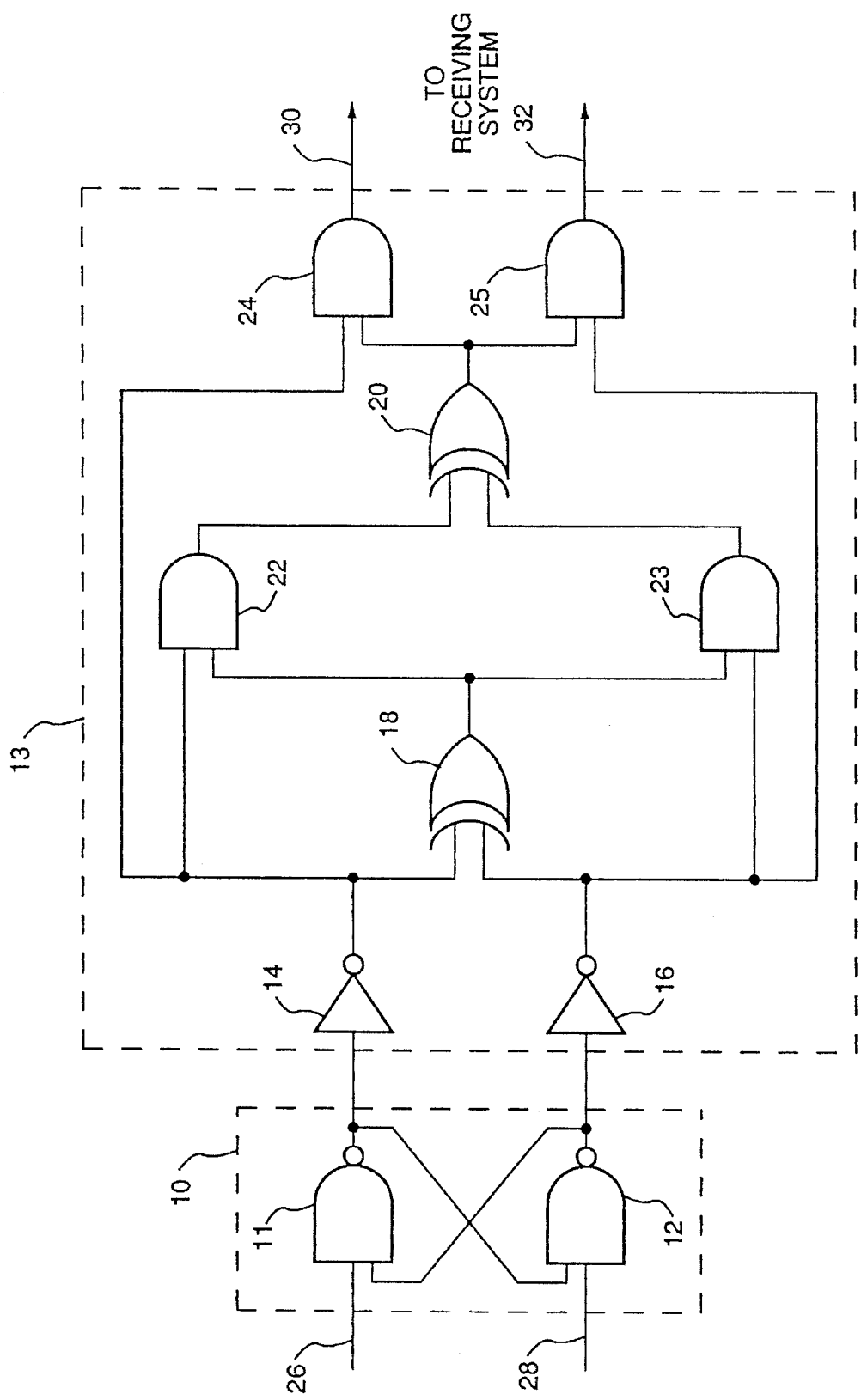
FIG. 2 is a schematic diagram illustrating a circuit for filtering metastability in accordance with the present invention.

Referring to FIG. 2, a schematic diagram is shown of a circuit for filtering metastability oscillation in accordance with a present invention. In this configuration, a metastability oscillation is generated at the output lines of a pair of cross-coupled NAND gates 11 and 12. The cross-coupled NAND gates 11 and 12 are referred to collectively as a means 10 that generates metastability oscillation. The output lines of NAND gates 11 and 12 are coupled to a metastability filter 13 that includes inverters 14 and 16, a pair of exclusive OR gates 18 and 20, and AND gates 22–25. AND gates 24 and 25 are connected to a signal receiving system at output lines 30 and 32.

During operation of the circuit, it is evident that when an input signal A at input line 26 and an input signal B at input line 28 are both low, the output signals of inverters 14 and 16 are also low. Thus, the output signals at output lines 30 and 32 remain low.

When input signal A is asserted high while input signal B is held low, the output of inverter 14 goes high as well as the output signal of exclusive OR gate 18. In turn, the output signal of AND gate 22 goes high and the output signal of exclusive OR gate 20 goes high. Consequently, the output signal at output line 30 goes high while the output signal at output line 32 remains low. The asserted signal at output line 30 thus triggers a response in the receiving system.

Similarly, if input signal B is asserted high while input signal A is held low, it is analogously evident that the output signal at output line 32 goes high while the output signal at output line 30 remains low.

If input signals A and B are asserted high simultaneously, the output signals of NAND gates 11 and 12 also go high simultaneously, resulting in metastability oscillation. That is, the output signals at the output lines of NAND gates 11 and 12 simultaneously oscillate between high and low. The signals oscillate until becoming unsynchronized due to the inherently different delay characteristics of NAND gates 11 and 12. Eventually, one of the output signals of NAND gates 11 and 12 settles to a high state while the other output signal settles to a low state.

During the metastability oscillation period of NAND gates 11 and 12, the output signal of exclusive OR gate 18 remains low since its input lines are each either simultaneously high or simultaneously low. Accordingly, the output signal of exclusive OR gate 20 remains low and prevents the assertion of both the output signal at output line 30 and the output signal at output line 32. When the metastability of NAND gates 11 and 12 settles, the output of exclusive OR gate 18 goes high, thus enabling one of the output lines 30 or 32 to be asserted.

The circuit of FIG. 2 therefore prevents the simultaneous assertion of output lines 30 and 32. The digital system receiving the signals at output lines 30 and 32 is therefore not adversely effected by the metastability of NAND gates 11 and 12.

It is noted that the circuit in accordance with the present invention prevents the adverse effects of metastability while introducing only a small increase in time delay associated with the signals at output lines 30 and 32. In a typical situation when there is no contest, a delay of only approximately 2–3 nanoseconds is introduced as a result of the signal paths formed between the input lines of inverters 14 and 16 and the output lines 30 and 32. During a contest situation, a somewhat longer delay occurs. However, this delay is much less in comparison to the delay of metastability filters that incorporate flip-flops. Therefore, a relatively fast circuit is provided for filtering metastability.

It is furthermore noted that exclusive OR gate 20 and AND gates 22 and 23 are provided to match the delay of the metastability filter 13 to the metastability oscillation characteristics of NAND gates 11 and 12. In particular, the exclusive OR gate 20 and the AND gates 22 and 23 prevent the enablement of AND gates 24 and 25 when the inputs to exclusive OR gate 18 are only slightly unsynchronized during the metastability oscillation period. Depending upon the characteristics of the means 10 that generates metastability oscillation, exclusive OR gate 20 and AND gates 22 and 23 may not be required. In such a case, the output line of exclusive OR gate 18 is connected directly to AND gates 24 and 25.

It is finally noted that the means 10 that generates metastability oscillation could have a variety of alternative configurations. For example, a pair of cross-coupled NOR gates could be used.

Figure 3:
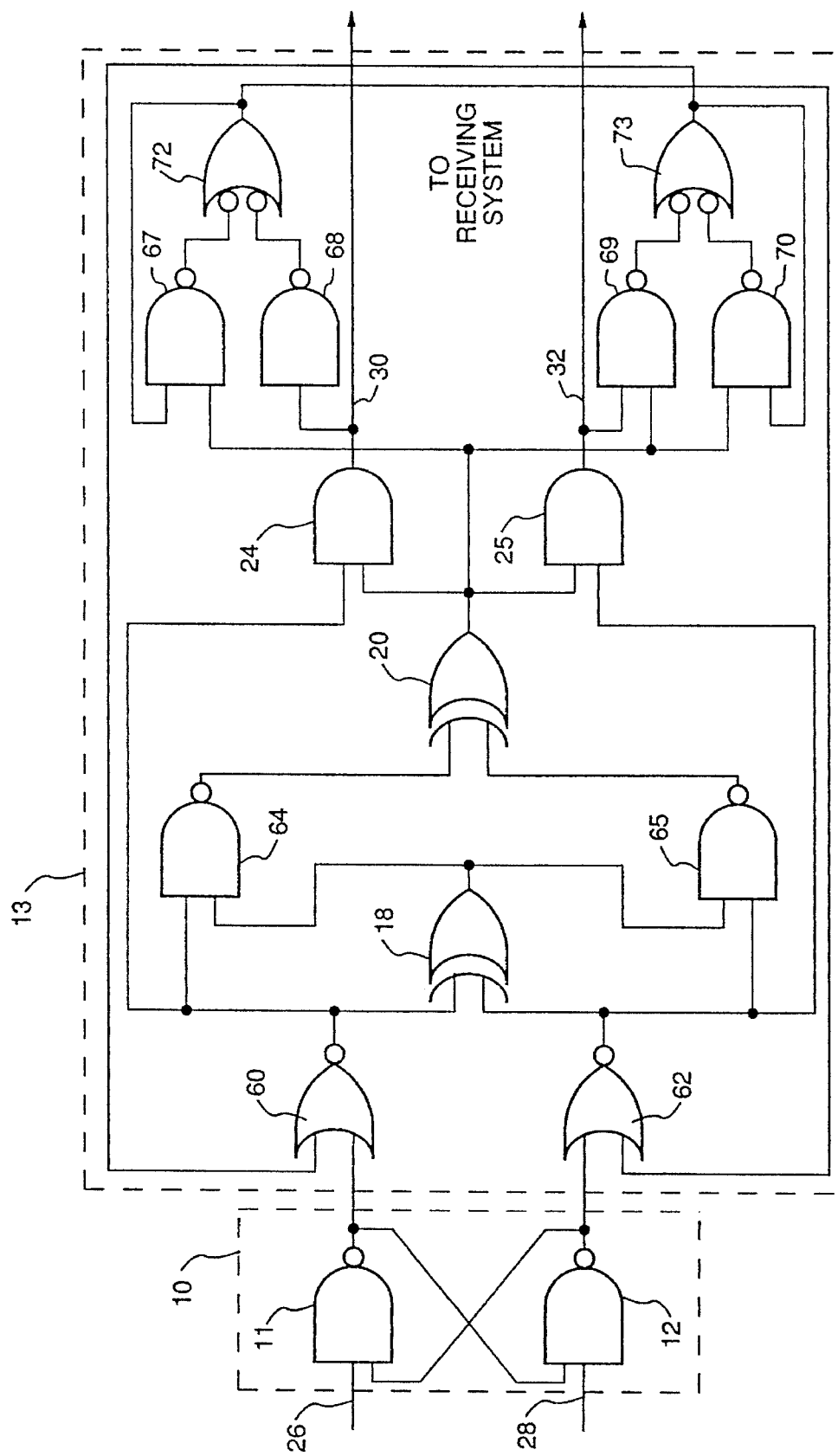
FIG. 3 is a schematic diagram illustrating a circuit for filtering metastability in accordance with a second embodiment of the invention.

Referring next to FIG. 3, a second embodiment of the invention is shown. The circuit of FIG. 3 is similar to that of FIG. 2 with the exception that inverter gates 14 and 16 are replaced with NOR gates 60 and 62, and AND gates 22 and 23 are replaced with NAND gates 64 and 65. In addition, the circuit further includes NAND gates 67–70 and OR gates 72 and 73 each having a pair of inverting input terminals. Corresponding components in FIGS. 2 and 3 are numbered identically. It is noted that NAND gates 64 and 65 could be replaced with AND gates without changing the circuit function. In this case, the utilization of NAND gates allows for slightly faster operation. In addition, it is noted that gates 72 and 73 are equivalent to NAND gates.

The additional logic of FIG. 3 is incorporated to prevent a "glitch" in the output signal associated with the circuit of FIG. 2. Referring to FIG. 2 in conjunction with the timing diagrams of FIGS. 4A–4E, the glitch occurs when both input signals at lines 26 and 28 are asserted high. FIGS. 4A and 4B illustrate the input signals provided to lines 26 and 28, respectively, and FIGS. 4C and 4E illustrate the output signals generated at lines 30 and 32, respectively. FIG. 4D illustrates the signal at the output line of exclusive or gate 20. It is evident that the signal provided to line 26 is asserted prior to the signal provided to line 28. Thus, the output of exclusive OR gate 20 goes high as shown in FIG. 4D. Following a short delay, output line 30 goes high (FIG. 4C). Immediately after the winning signal at line 26 goes low, the signal at the output line of exclusive OR gate 20 momentarily remains high and then goes low. Following a short delay period, the output line of exclusive OR gate 20 returns high (FIG. 4D). As shown in FIG. 4E, the output line 32 of the loser signal glitches low due to short low period of the exclusive or gate 20 and then returns high. The additional logic as shown in FIG. 3 eliminates this low pulse generated at the leading edge of the loser signal (at output line 32). The additional logic is not required if only the leading edge of the winning signals needs to be non-glitching. In addition, the additional logic of FIG. 3 guarantees that a new pulse is generated as a result of the losing signal after the winning signal is deasserted. When the winner signal is asserted, the other input line is blocked out until the winner signal is deasserted, i.e., the winner signal must be deasserted before the loser signal is presented at an output line. It is noted that although the additional logic of FIG. 3 causes the loser signal to wait longer to allow for the glitch removal, little side effect occurs.

Figure 1:
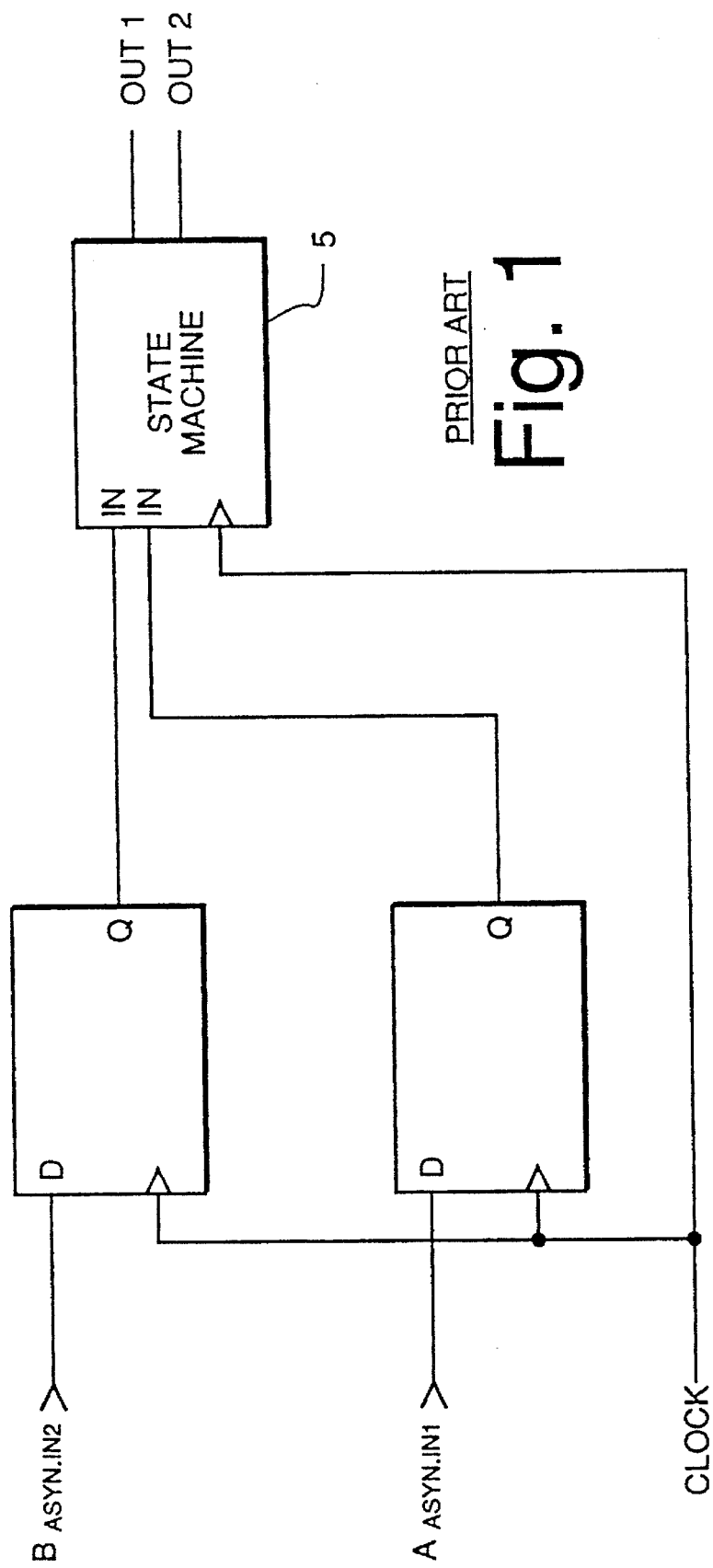
FIG. 1 is a block diagram of a prior art system for filtering metastability.

The metastability oscillation filter 13 may also be configured with three or more input lines and three or more output lines. In such a situation, additional output AND gates would be provided in parallel with output AND gates 24 and 25. Each of the output AND gates would be enabled by logic similar to that of FIG. 1 such that the output AND gates are enabled only when a single input line has an associated asserted signal.

FIG. 5 illustrates a three input metastability filter circuit in accordance with the invention. The circuit of FIG. 5 includes NAND gates 101–103, AND gates 105–113, inverters 115–117, and blocks 120 and 121. Blocks 120 and 121 are RAM or logic circuits that implement a one-and-only-one-input-set encoder. FIG. 5A illustrates a truth table representative of the encoder blocks 120 and 121, and FIG. 5B illustrates a typical circuit implementation. It is evident that, similar to the exclusive OR gates used in the above embodiments, the respective output line of each encoder block 120 and 121 is active only when one and only one of its corresponding input signals are active. It is evident that the operation of the three-input system is similar to the operation of the circuit of FIG. 1 described above.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in the limiting sense. The scope of the claimed invention is better defined with reference to the following claims.

I claim:

1. A circuit including a generating means for generating a plurality of signals characterized by metastability oscillation, the generating means having at least a first terminal, a second terminal, and a third terminal whereat the metastability oscillation characteristic occurs, the generating means being coupled to a metastability filter, the metastability filter comprising:

a one-and-only-one-input-set encoding means having three or more input lines and an output line, and wherein an enable signal generated by said encoding means has a predetermined level only when a single signal is asserted at one of said three or more input lines; and an output enable circuit coupled to receive said enable signal from said encoding means, the output enable circuit including at least a first output line, a second output line, and a third output line the output enable circuit enabling an output signal onto one of said first, second, or third output lines only when said enable signal is provided at said predetermined level by said encoding means.

2. The circuit as recited in claim 1 wherein said encoding means comprises an exclusive OR gate.

3. The circuit as recited in claim 2 wherein said output enable circuit comprises first and second and third AND gates, wherein each of said AND gates is coupled to an output line of said exclusive OR gate.

4. A circuit including a generating means for generating signals characterized by metastability oscillation, the generating means having at least a first terminal and a second terminal whereat the metastability oscillation characteristic occurs, the generating means being coupled to a metastability filter, the metastability filter comprising:

a first exclusive OR gate having a first input line coupled to said first terminal, and a second input line coupled to said second terminal;

a first AND gate having an output line, a first input line coupled to said first terminal, and a second input line coupled to an output line of said first exclusive OR gate;

a second AND gate having an output line, a first input line coupled to said second terminal, and a second input line coupled to said output line of said first exclusive OR gate;

a second exclusive OR gate havinq a first input line coupled to the output line of said first AND gate and a second input line coupled to the output line of said second AND gate;

a third AND gate havinq a first input line coupled to an output line of said second exclusive OR gate and a second input line coupled to said first terminal; and a fourth AND gate havinq a first input line coupled to said output line of said second exclusive OR gate and a second output line coupled to said second terminal.

5. The circuit as recited in claim 4 wherein said generating means comprises at least a pair of cross-coupled NAND gates.

6. The circuit as recited in claim 4 wherein said first and second AND gates are enabled by said first exclusive OR gate when an input signal at said first terminal is logically opposite to a signal at said second terminal.

7. A circuit for filtering metastability having an input terminal and an output terminal, comprising:

a first NAND gate having an input line coupled to said input terminal;

a second NAND gate coupled in a cross-coupled configuration with said first NAND gate;

a first inverter coupled to an output line of said first NAND gate;

a second inverter coupled to an output line of said second NAND gate;

a first exclusive OR gate having a first input line coupled to said first inverter and a second input line coupled to said second inverter;

a first AND gate coupled to an output line of said first exclusive OR gate and to said first inverter;

a second AND gate coupled to said output line of said first exclusive OR gate and to said second inverter;

a second exclusive OR gate coupled to an output line of said first AND gate and to an output line of said second AND gate;

a third AND gate coupled to an output line of said second exclusive OR gate and to said first inverter, said third AND gate having an output line coupled to said output terminal; and a fourth AND gate coupled to said output line of said second exclusive OR gate and to said second inverter.

8. A circuit for filtering metastability, said circuit having a first input terminal, a second input terminal, a first output terminal, and a second output terminal, comprising:

a first NAND gate having an input line which is coupled to said first input terminal;

a second NAND gate connected in a cross-coupled configuration with said first NAND gate, said second NAND gate having an input line which is coupled to said second input terminal;

a first inverter connected to an output line of said first NAND gate;

a second inverter coupled to an output line of said second NAND gate;

an exclusive OR gate having a first input line coupled to said first inverter and a second input line coupled to said second inverter;

a first AND gate coupled to an output line of said first exclusive OR gate and to said first inverter;

a second AND gate coupled to said output line of said first exclusive OR gate and to said second inverter;

a second exclusive OR gate coupled to an output line of said first AND gate and to an output line of said second AND gate;

a third AND gate coupled to an output line of said second exclusive OR gate and to said first inverter, said third AND gate having an output line which is coupled to said first output terminal; and a fourth AND gate coupled to said output line of said second exclusive OR gate and to said second inverter, said fourth AND gate having an output line which is coupled to said second output terminal.

* * * * *